(12) United States Patent
Kim et al.

(10) Patent No.: US 10,651,083 B2
(45) Date of Patent: May 12, 2020

(54) GRADED INTERCONNECT CAP

(71) Applicant: International Business Machines Corporation, Armonk, NY (US)

(72) Inventors: Andrew Tae Kim, Poughkeepsie, NY (US); Baozhen Li, South Burlington, VT (US); Ernest Y. Wu, Essex Junction, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/911,313

(22) Filed: Mar. 5, 2018

(65) Prior Publication Data
US 2019/0273022 A1 Sep. 5, 2019

(51) Int. Cl.
*H01L 23/52* (2006.01)
*H01L 21/768* (2006.01)
*H01L 23/532* (2006.01)

(52) U.S. Cl.
CPC .. *H01L 21/76849* (2013.01); *H01L 21/76856* (2013.01); *H01L 23/53238* (2013.01)

(58) Field of Classification Search
CPC ......... H01L 21/76898; H01L 21/76831; H01L 21/76224; H01L 21/76808; H01L 23/53238
See application file for complete search history.

(56) References Cited

U.S. PATENT DOCUMENTS

| | | | |
|---|---|---|---|
| 6,211,040 B1* | 4/2001 | Liu | H01L 21/02164 257/E21.279 |
| 6,521,523 B2 | 2/2003 | Lee et al. | |
| 6,566,262 B1 | 5/2003 | Rissman et al. | |
| 6,960,519 B1* | 11/2005 | Dalton | H01L 21/76804 257/E21.578 |
| 7,291,558 B2 | 11/2007 | Gefken et al. | |
| 8,299,617 B2 | 10/2012 | Morrow et al. | |
| 9,190,323 B2 | 11/2015 | Zhang et al. | |
| 9,437,545 B2 | 9/2016 | He et al. | |
| 9,472,450 B2 | 10/2016 | Bonilla et al. | |
| 2004/0207093 A1 | 10/2004 | Sun et al. | |
| 2006/0175708 A1* | 8/2006 | Ueno | H01L 21/76825 257/774 |

(Continued)

FOREIGN PATENT DOCUMENTS

CN 103779269 5/2014

*Primary Examiner* — Jaehwan Oh
(74) *Attorney, Agent, or Firm* — ZIP Group PLLC

(57) ABSTRACT

A graded cap is formed upon an interconnect, such as a back end of line wire. The graded cap includes a microstructure that uniformly changes from a metal nearest the interconnect to a metal nitride most distal from the interconnect. The graded cap is formed by nitriding a metal cap that is formed upon the interconnect. During nitriding an exposed one or more perimeter portions of the metal cap become a metal nitride with a larger amount or concentration of Nitrogen while one or more inner portions of the metal cap nearest the interconnect may be maintained as the metal or become the metal nitride with a fewer amount or concentration of Nitrogen. The resulting graded cap includes a gradually or uniformly changing microstructure between the one or more inner portions and the one or more perimeter portions.

7 Claims, 10 Drawing Sheets

(56) References Cited

U.S. PATENT DOCUMENTS

| | | | |
|---|---|---|---|
| 2008/0054466 A1 | 3/2008 | Nasu et al. | |
| 2008/0241575 A1 | 10/2008 | Lavoie et al. | |
| 2009/0075472 A1* | 3/2009 | Arnold | H01L 21/02063 438/623 |
| 2010/0032829 A1* | 2/2010 | Anderson | H01L 21/3105 257/737 |
| 2010/0081275 A1* | 4/2010 | Ishizaka | H01L 21/02063 438/653 |
| 2011/0256726 A1* | 10/2011 | LaVoie | C23C 16/045 438/702 |
| 2012/0306081 A1* | 12/2012 | Ishizaki | H01L 21/764 257/751 |
| 2014/0138837 A1* | 5/2014 | Niu | H01L 21/76846 257/773 |

\* cited by examiner

GRADED INTERCONNECT CAP

FIELD

Embodiments of invention generally relate to a semiconductor device. More particularly, embodiments relate to formation of a graded cap upon an interconnect. The graded cap includes a graded microstructure that uniformly changes from a metal nearest the interconnect to a dielectric most distal from the interconnect.

BACKGROUND

As integrated circuit feature sizes continue to decrease, it has become advantageous to construct metal interconnects out of copper. Copper has a low resistivity and therefore can form higher speed connections for a given wire width. However, Copper does have disadvantages that must be overcome. For example, copper is much more susceptible to oxidation during processing. Copper also tends to diffuse into adjacent materials, including dielectrics. To use copper for interconnections, therefore, it is necessary to encapsulate the copper in barrier materials.

After the copper interconnect is fabricated, a barrier layer or cap is formed thereupon, typically called a sealing layer. Typically in the art, this sealing layer (also called a cap layer, or an encapsulation layer) is formed from a material that has the highest dielectric constant value within the BEOL metalization or wiring stack and may thus adversely impact the capacitance within the BEOL metalization or wiring stack.

SUMMARY

In an embodiment of the present invention, a method of semiconductor device fabrication is presented. The method includes forming a first intermetal dielectric layer upon a substrate and forming an interconnect trench within the first intermetal dielectric layer that exposes a portion of the substrate. The method further includes forming a liner within the interconnect trench and forming an interconnect upon the liner filing the interconnect trench. The method further includes forming a metal cap upon only the interconnect and forming a graded cap by nitriding the metal cap.

In another embodiment of the present invention, a semiconductor structure is presented. The semiconductor structure includes a first intermetal dielectric layer upon a substrate and an interconnect trench within the first intermetal dielectric layer. The semiconductor structure further includes a liner within the interconnect trench upon sidewalls of the first intermetal dielectric layer and upon the substrate, an interconnect upon the liner that fills the interconnect trench, and a graded cap upon only the interconnect.

In another embodiment of the present invention, a integrated circuit chip is presented. The integrated circuit chip includes a first intermetal dielectric layer upon a substrate and an interconnect trench within the first intermetal dielectric layer. The semiconductor structure further includes a liner within the interconnect trench upon sidewalls of the first intermetal dielectric layer and upon the substrate, an interconnect upon the liner that fills the interconnect trench, and a graded cap upon only the interconnect.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention relate to the formation of a graded cap upon an BEOL interconnect, such as a wire. The graded cap includes a microstructure that uniformly changes from a metal nearest the interconnect to a dielectric most distal from the interconnect. The graded cap is formed by forming a metal cap upon the interconnect. The metal cap is subsequently nitrified so that one or more exposed perimeter surfaces of the metal cap become a metal nitride while one or more inner portions of the metal cap nearest the interconnect are maintained as metal. The resulting graded cap includes a gradually or uniformly changing microstructure of metal nearest the interconnect to metal nitride nearest the one or more metal cap perimeter surfaces.

Referring now to the figures, wherein like components are labeled with like numerals, exemplary structures of a semiconductor device, in accordance with embodiments of the present invention are shown and will now be described in greater detail below. The specific number of components depicted in the figures and the cross-section orientation was chosen to best illustrate the various embodiments described herein.

Figure 1:
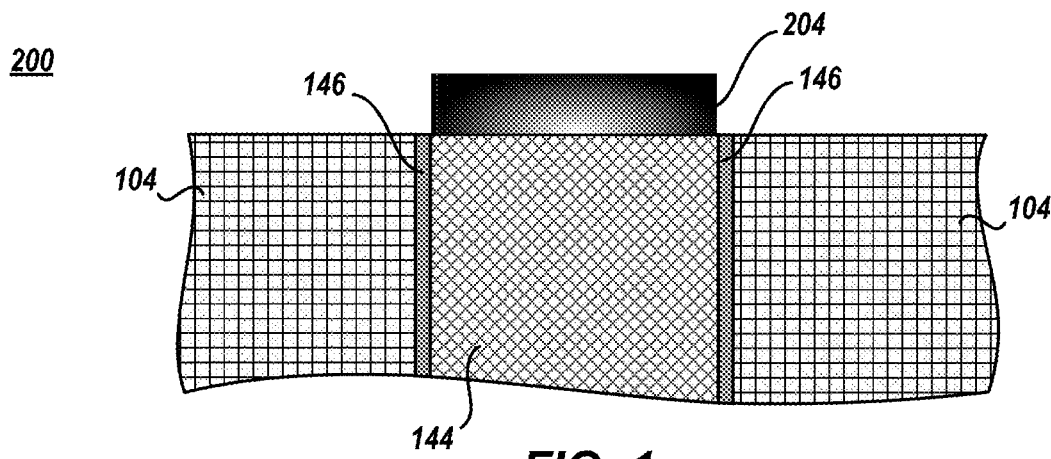
FIG. 1-FIG. 3 depict cross-section views of exemplary graded interconnect caps, in accordance with one or more embodiments of the present invention.

FIG. 1 depicts a cross-section view of semiconductor structure 200 that includes graded cap 204. Graded cap 204 is formed upon an interconnect 144, such as a back end of line wire. The interconnect 144 is formed between a liner 146. The liner 146 is formed upon a trench within a first intermetal dielectric (IMD) layer 104. The graded cap 204 includes a microstructure that uniformly changes from a metal nearest the interconnect 144 to a metal nitride most distal from the interconnect 144. The graded cap 204 includes a gradually or uniformly changing microstructure between the metal nearest the interconnect 144 and the metal nitride most distal from the interconnect 144.

Figure 2:
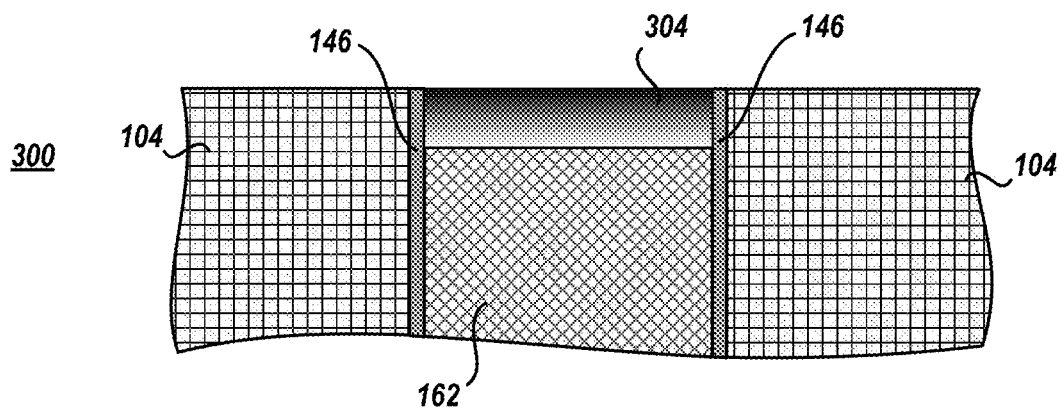

FIG. 2 depicts a cross-section view of semiconductor structure 300 that includes graded cap 304, in accordance with one or more embodiments of the present invention. Graded cap 304 is formed upon a recessed interconnect 162, such as a back end of line wire. The recessed interconnect 162 is formed between liner 146. The graded cap 304 includes a microstructure that uniformly changes from a metal nearest the recessed interconnect 162 to a metal nitride most distal from the recessed interconnect 162. The graded cap 304 includes a gradually or uniformly changing microstructure between the metal nearest the recessed interconnect 162 and the metal nitride most distal from the recessed interconnect 162.

Figure 3:
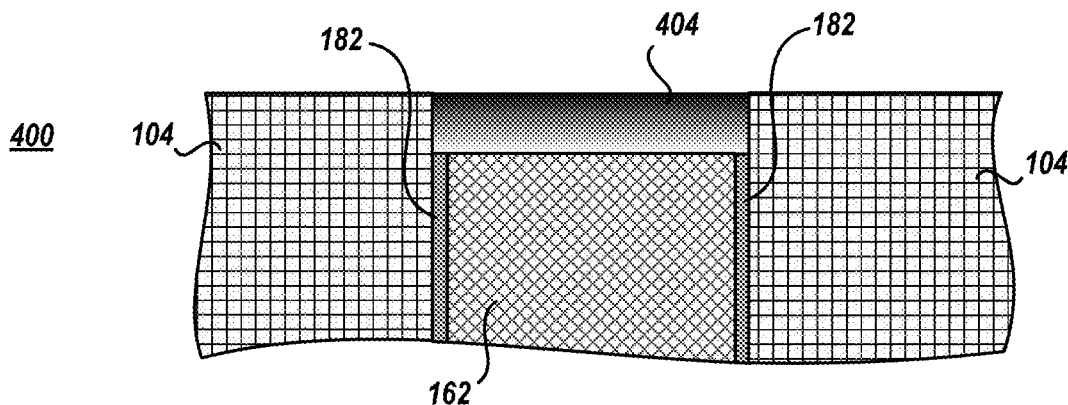

FIG. 3 depicts a cross-section view of semiconductor structure 400 that includes graded cap 404, in accordance with one or more embodiments of the present invention. Graded cap 404 is formed upon a recessed interconnect 162. The recessed interconnect 162 is formed between a recessed liner 182. The liner 182 is formed upon a trench within a first IMD layer 104. The graded cap 404 includes a microstructure that uniformly changes from a metal nearest the interconnect 162 to a metal nitride most distal from the interconnect 162. The graded cap 404 includes a gradually or uniformly changing microstructure between the metal nearest the interconnect 162 and the metal nitride most distal from the interconnect 162.

Figure 4:
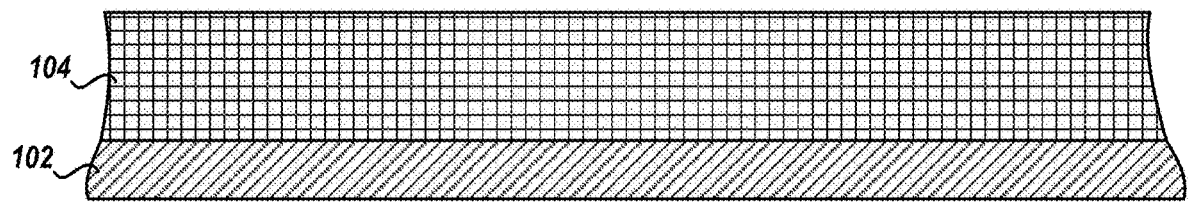
FIG. 4-FIG. 10 depict cross-section views of exemplary semiconductor structures at various stages of semiconductor device fabrication, in accordance with one or more embodiments of the present invention.

FIG. 4 shows a cross-sectional view of a semiconductor structure 100. Structure 100 includes a substrate 102 that may have many layers deposited thereon for the formation of wiring lines. Structure 100 also includes the IMD layer 104. The substrate 102 may contain a variety of elements, including, for example, transistors, diodes, and other semiconductor elements (not shown) as are well known in the art. The substrate 102 may also contain other metal interconnect layers. The IMD layer 104 is formed overlying the substrate 102 where the interconnect or interconnects are to be formed. The first intermetal dielectric layer 104 may consist of one or more commonly used dielectric materials in semiconductor processing. For example, the first IMD 104 may be silicon dioxide, borophosphosilicate glass (BPSG), phosphosilicate glass (PSG), low-k materials such as fluorosilicate glass (FSG), or ultra low-k materials, such as porous SiOH. A low-k dielectric is a dielectric material with a dielectric constant less than that of silicon dioxide. An ultra low k dielectric is a dielectric material with a dielectric constant less than 1.9.

Figure 5:
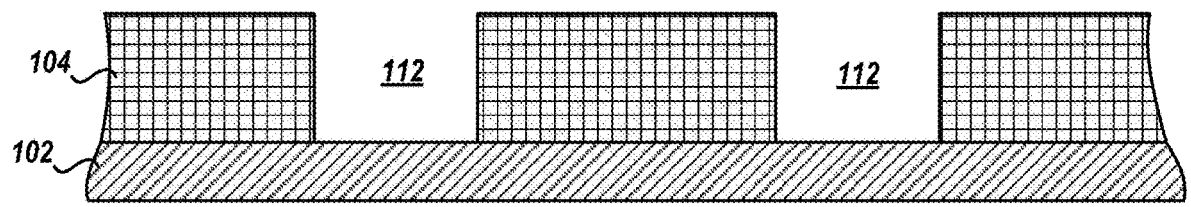

FIG. 5 shows a cross-sectional view of semiconductor structure 110. Structure 110 includes interconnect trenches 112 within the first IMD 104. The trenches 112 may be formed by etching the IMD 104 through a photoresist mask which is not shown. This etching step may form interconnect trenches 112 in the first IMD 104. The interconnect trenches 112 may be formed by a conventional reactive ion etch (RIE). In this embodiment, the present invention will be used to create graded interconnect caps on copper interconnects formed in a single damascene process. It will be understood by those skilled in the art that the embodiments could be applied to a dual damascene process. In such cases, an interconnect hole is formed inside the interconnect trenches 112 for contact between the subsequently formed interconnect and some underlying layer, element, or feature.

Figure 6:
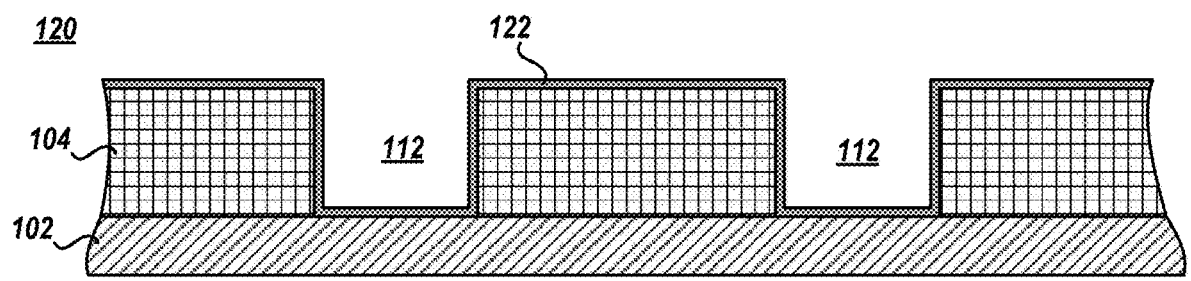

FIG. 6 shows a cross-sectional view of semiconductor structure 120. Structure 120 includes a liner layer 122 overlying the first IMD 104 and lining the interconnect trenches 112. Liner layer 122 may be formed by depositing liner material upon the first IMD 104 and within the interconnect trenches 112. The material of liner layer 122 prevent oxidation and diffusion of the subsequently deposited copper interconnect into the first IMD 104 or substrate 102. The liner layer 122 may be composed of any of several metals such a low-k dielectric; metal such as tantalum (Ta), titanium (Ti), cobalt (Co), ruthenium (Ru) or tungsten (w); and/or metal nitrides such as titanium nitride (TiN), tantalum nitride (TaN), and tungsten nitride (WN).

Figure 7:
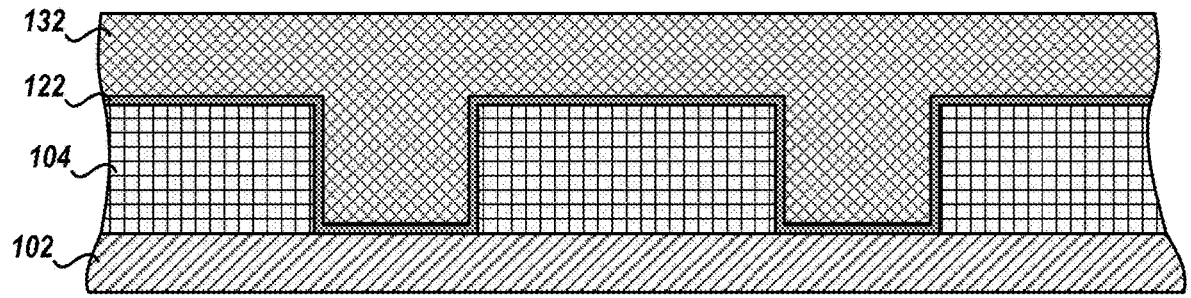

FIG. 7 shows a cross-sectional view of semiconductor structure 130. Structure 130 includes a copper layer 132 upon liner layer 122. Copper layer 132 may be formed by depositing copper overlying the liner layer 122 and filling the interconnect trenches 112. A seed layer (not shown) may be initially deposited upon layer 122 using physical vapor deposition (PVD) or chemical vapor deposition (CVD). Then the copper layer 132 is deposited by electrochemical plating over the seed layer. The copper layer 132 may be formed upon the liner layer 122 by other known techniques.

Figure 8:
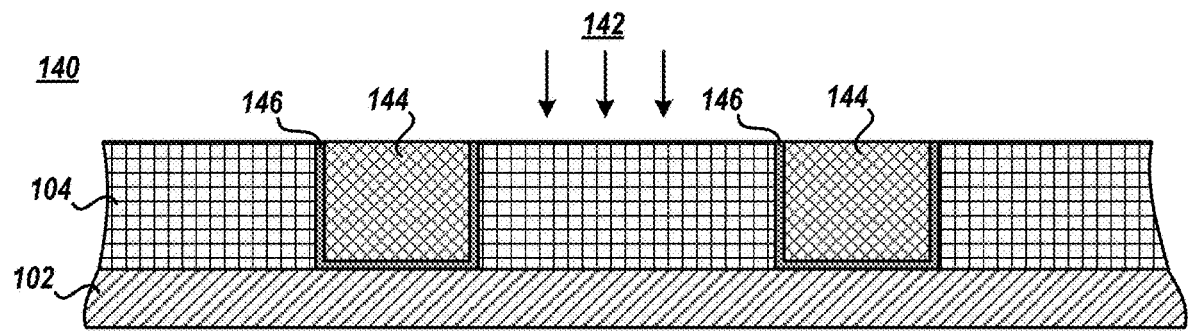

FIG. 8 shows a cross-sectional view of semiconductor structure 140. Structure 140 includes an interconnect 144 and a liner 146 within the first IMD 104. The liner 146 is between the interconnect 144 and the first IMD 104 and between the interconnect 144 and substrate 102. The copper layer 132 and the layer 122 in FIG. 7 may be polished back or partially removed using a chemical-mechanical polishing (CMP) process 142 to a plane that is coplanar with the upper surface of the first IMD. Remaining copper of copper layer 132 and remaining layer 122 material below the plane that is coplanar with the upper surface of the first IMD within contact trench 112 may form interconnect 144 and liner 146. Interconnect 144 and liner 146 may be formed by other known techniques.

Figure 9:
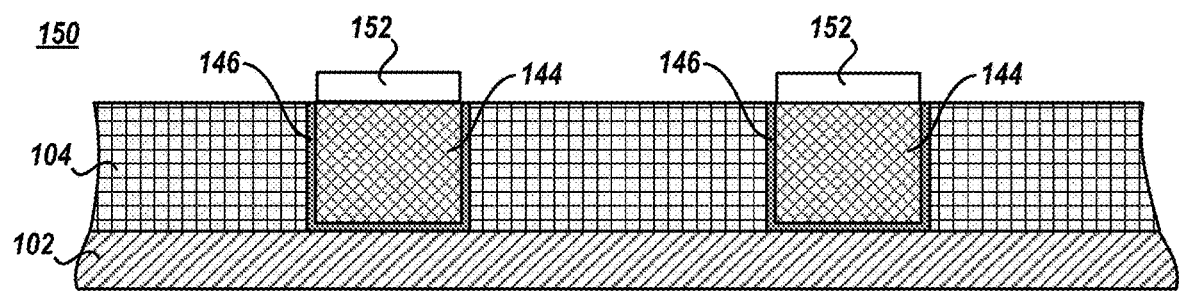

FIG. 9 shows a cross-sectional view of semiconductor structure 150. Structure 150 includes metal caps 152 upon copper interconnects 144. Metal caps 152 may be formed by selectively forming metal, such as Aluminum, using selective chemical vapor deposition (CVD), atomic level deposition (ALD), physical vapor deposition (PVD), plating or other appropriate deposition method, upon only the interconnects 144. The metal caps 152 may be formed to a thickness that is less than traditional interconnect caps to eventually reduce the overall capacitance of the BEOL interconnect layers as is further described below.

Figure 10:
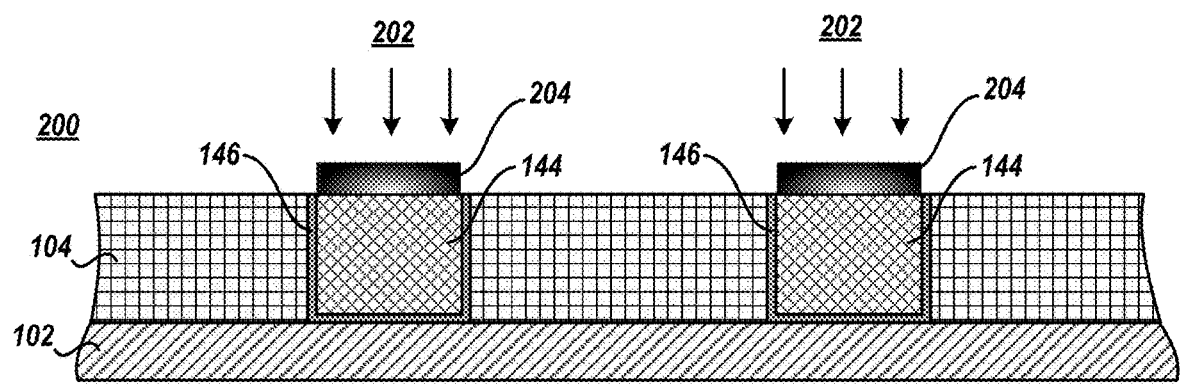

FIG. 10 shows a cross-sectional view of semiconductor structure 200. Structure 200 includes graded caps 204 formed from metal caps 152 by subjecting the metal caps 152 to a controlled nitriding processes 202. Nitriding process 202 is a heat-treating process that diffuses nitrogen into the metal caps 152 to form graded caps 204. The nitriding process 202 is controlled to generate the graded microstructure of graded cap 204. For example, the time structure 150 is subjected to process 202 is controlled to result in the specified graded microstructure of graded cap 204.

Figure 20:
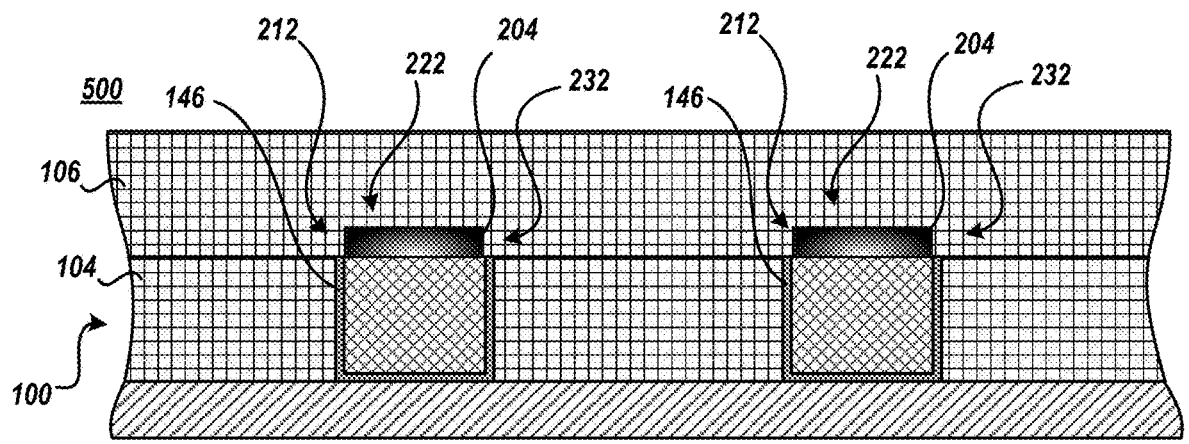
FIG. 20-FIG. 22 depict cross-section views of exemplary semiconductor structures at a respective stage of semiconductor device fabrication, in accordance with one or more embodiments of the present invention.

Graded cap 204 may function as a localized sealing layer cap upon only the interconnect 144 to prevent copper diffusion and oxidation of interconnect 144. Therefore, referring to FIG. 20, a second 1 MB layer 106 can be deposited upon exposed surfaces 212, 222, and 232 of graded cap 204, upon exposed upper surfaces of liner 146, and upon exposed upper surface of the first IMD 104 without a conventional sealing layer therebetween to form semiconductor structure 500. In another scheme, a conventional sealing layer is formed upon exposed surfaces 212, 222, and 232 of graded cap 204, upon exposed upper surfaces of liner 146, and upon exposed upper surface of the first IMD 104. Subsequently the second 1 MB 106 may be deposited upon the conventional sealing layer.

Figure 11:
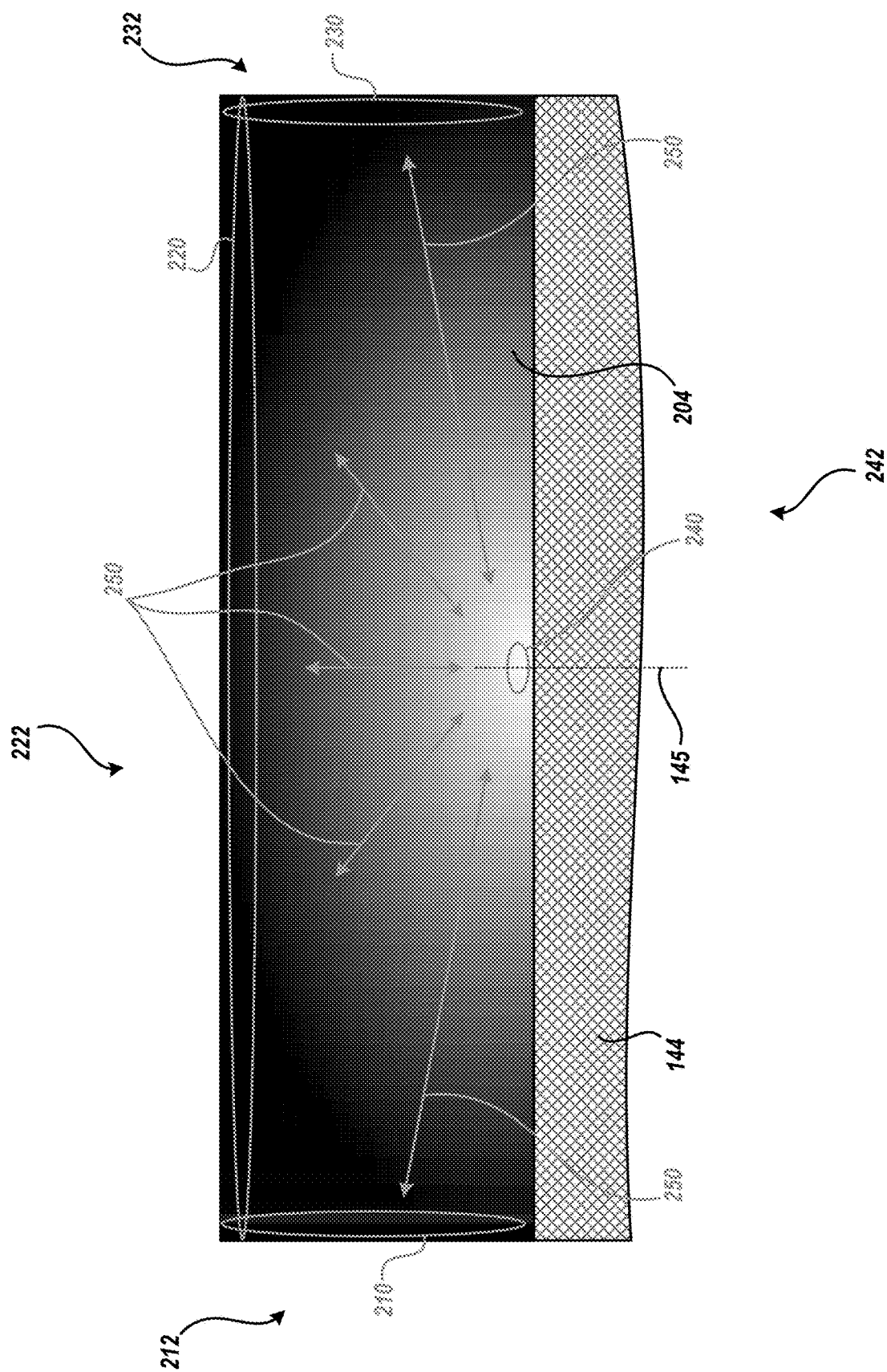
FIG. 11 depicts a detailed cross-section view of an exemplary graded interconnect cap, in accordance with one or more embodiments of the present invention.

FIG. 11 depicts a detailed cross-section view of graded interconnect cap 204. The metal cap 152 and resulting graded cap 204 have one or more sidewall surfaces (e.g., left sidewall surface 212 and right sidewall surface 232), one or more interconnect facing surface (e.g., lower surface 242), and one or more interconnect away-facing surface (e.g., upper surface 222). The sidewall surface(s) and the interconnect away-facing surface(s) are exposed (i.e. are not protected) and subjected to nitrogen by process 202. In other words, during process 202 nitrogen is diffused into metal cap 152 at the exposed metal cap 152 surface(s). On the other hand, because the one or more interconnect facing surfaces are protected by interconnect 144 those one or more interconnect facing surfaces are not directly exposed to nitrogen in process 202 and nitrogen does not diffuse into graded cap 204 therefrom.

The graded microstructure of graded cap 204 includes the gradually or uniformly changing microstructure from a first material that has a first metal to nitrogen ratio at an internal location of cap 204 to a second material that has a second metal to nitrogen ratio that has an increased quantity of Nitrogen relative to the first metal to nitrogen ratio at a perimeter location of cap 204. Graded cap section 240 is entirely within the graded cap 204 nearest the interconnect 144 facing surface(s) at the intersection of the graded cap 204 and interconnect 144 and may be bisected by a bisector 145 of interconnect 144. Section 210 and 230 are entirely within the graded cap 204 nearest associated sidewall surfaces (e.g., left sidewall surface 212 and right sidewall surface 232). Section 220 is entirely within the graded cap 204 nearest associated away-facing surface(s) (e.g., upper surface 222).

In a first implementation, the first material at section 240 may be pure metal with no Nitrogen and the second material at sections 210, 220, and 230 may be the metal nitride with the percent Nitrogen greater than zero percent. In a second implementation, the second material at sections 210, 220, and 230 may be the metal nitride with a percent Nitrogen approaching the stoichiometric amount of Nitrogen to form the metal nitride, or a maximum percentage of Nitrogen possible within the metal nitride, and the first material at section 240 is the metal nitride with a percent Nitrogen less than the aforementioned amount of Nitrogen. The second implementation may be most beneficial to reduce the overall capacitance of the BEOL wiring stack. In a third implementation, the first material at section 240 may be the metal nitride with a variable "n" percent Nitrogen, wherein "n" is greater than zero. The second material at sections 210, 220, and 230 may be the metal nitride with the percent Nitrogen greater than "n" percent and less than "m" percent, wherein "m" is less than the maximum percentage of Nitrogen of the metal nitride.

Graded cap 204 includes a gradient 250 of gradually or uniformly changing microstructure from the first material at section 240 to the second material at sections 210, 220, and 230. The actual percent nitrogen in sections 210, 220, and 230 is dependent upon the thickness of metal caps 152, the time that metal caps 152 are subject to nitriding process 202, and the like. For example, as depicted in FIG. 11, the microstructure in section 240 has a lower or zero percent Nitrogen and is depicted as mostly white. The microstructure in sections 210, 220, and 230 have a greater percent Nitrogen are depicted as mostly black. Gradient 250 exists between section 240 and sections 210, 220, and 230 as is depicted by gradually or uniformly darkening from mostly white nearest section 240 to mostly black nearest sections 210, 220, and 230. The direction of gradient 250 is from or to any point within section 240 to or from any point within sections 210, 220, or 230. The gradient 250 is uniform if the change in percent nitrogen of microstructure material along gradient 250 per the same dimension of gradient 250 is constant.

Figure 12:
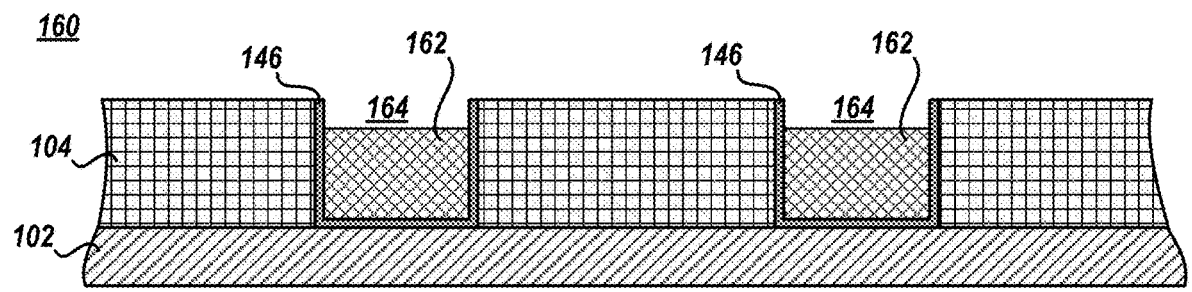
FIG. 12-FIG. 14 depict cross-section views of exemplary semiconductor structures at various stages of semiconductor device fabrication, in accordance with one or more embodiments of the present invention.

FIG. 12 shows a cross-sectional view of semiconductor structure 160. Structure 160 includes a recessed interconnect 162 and liner 146 within the first IMD 104. The liner 146 is upon the trench 112 walls between the interconnect 162 and the first IMD 104 and between the interconnect 144 and substrate 102. The copper layer 132 and the layer 122 in FIG. 7 may be polished back or partially removed using a chemical-mechanical polishing (CMP) process to a plane that is coplanar with the upper surface of the first IMD 104. Further copper layer 122 within interconnect trench 112 is partially removed from within trench 112 between liner 146 forming a cap trench 164 above the recessed interconnect 162 and below the plane that is coplanar with the upper surface of the first IMD 104. The cap trench 164 is a void between exposed sidewalls of liner 146 above recessed interconnect 162 and below the top surface of the first IMD 104. Recessed interconnect 162 may be formed by other known techniques.

Figure 13:
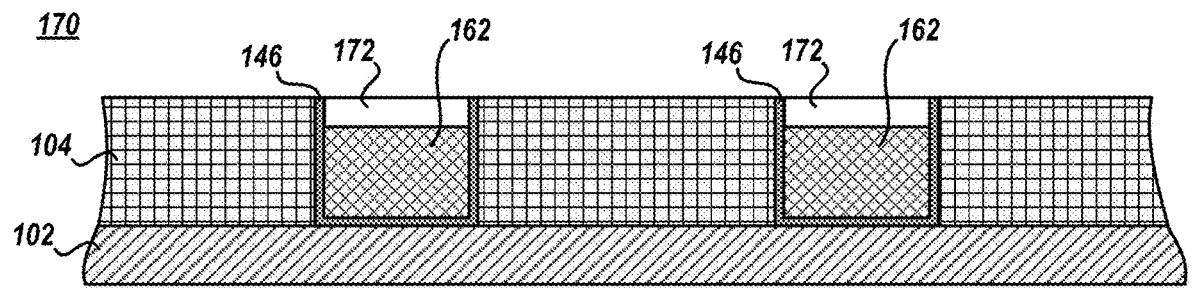

FIG. 13 shows a cross-sectional view of semiconductor structure 170. Structure 170 includes metal caps 172 within cap trench 164 upon recessed interconnects 162 between liner 146. Metal caps 172 may be formed by selectively forming metal, such as Aluminum, using selective CVD, ALD, PVD, plating or other appropriate deposition method, upon only the recessed interconnects 162 between liner 146. The metal caps 172 may be formed to a thickness that is less than traditional interconnect caps to eventually reduce the overall capacitance of the BEOL interconnect layers as is further described below. In other implementations, metal caps 172 may be formed upon interconnects 162 by other known selective metal deposition techniques. An upper surface of metal cap 172 may be coplanar with the upper surface of the first IMD 104 and/or coplanar with the upper surface of liner 146.

Figure 14:
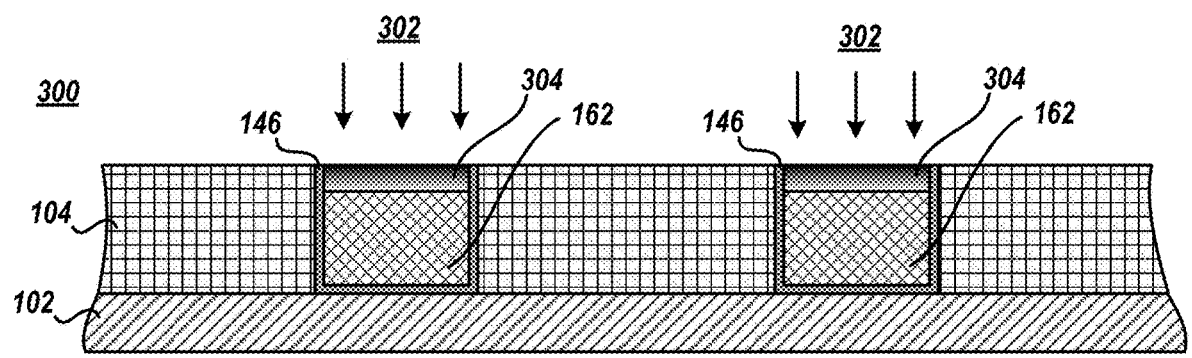

FIG. 14 shows a cross-sectional view of semiconductor structure 300. Structure 300 includes graded caps 304 formed from metal caps 172 by subjecting the metal caps 172 to a controlled nitriding processes 302. Nitriding process 302 is a heat-treating process that diffuses nitrogen into the metal caps 172 to form graded caps 304. The nitriding process 302 is controlled to generate the graded microstructure of graded cap 304. For example, the time structure 170 is subjected to process 302 is controlled to result in the specified graded microstructure of graded cap 304.

Figure 21:
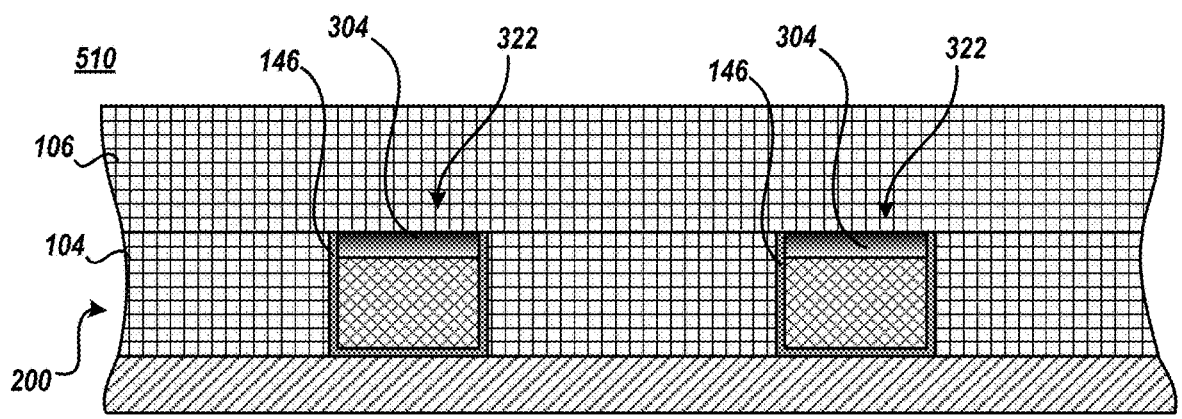

Graded cap 304 may function as a localized sealing layer cap upon only the recessed interconnect 162 to prevent copper diffusion and oxidation of interconnect 162. Therefore, referring to FIG. 21, a second IMD layer 106 can be deposited upon exposed surface 322 of graded cap 304, upon exposed upper surfaces of liner 146, and upon exposed upper surface of the first IMD 104 without a conventional sealing layer therebetween to form semiconductor structure 510. In other words, problems associated with the conventional sealing layer may be reduced or eliminated (e.g., TDDB improvement due to elimination of a possibly weak tri-material bond between the liner, interconnect, and conventional sealing layer). In another scheme, a conventional sealing layer is maintained and formed upon exposed surface 322 of graded cap 304, upon exposed upper surfaces of liner 146, and upon exposed upper surface of the first IMD 104. Subsequently the second IMD 106 may be deposited upon the conventional sealing layer.

Figure 15:
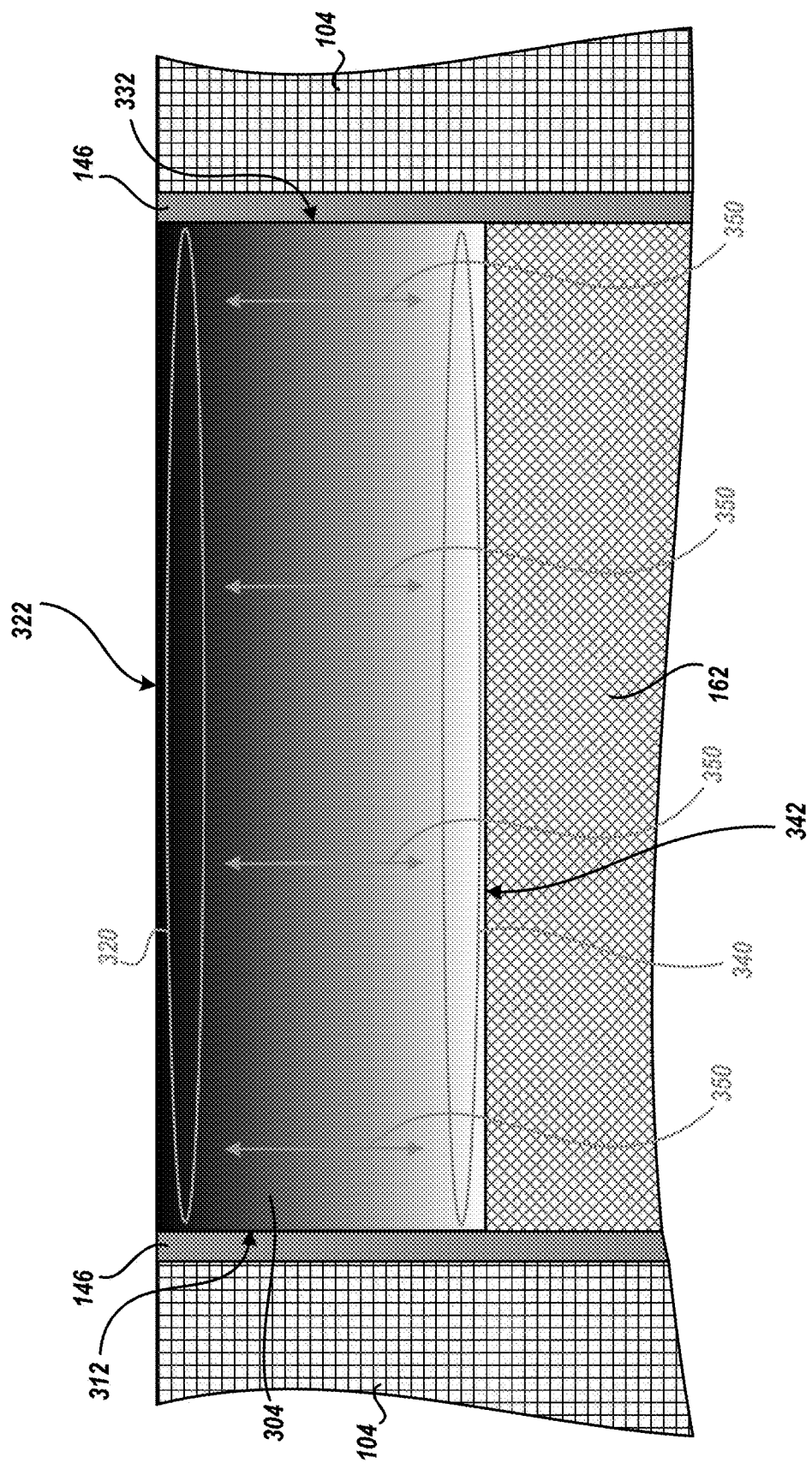
FIG. 15 depicts a detailed cross-section view of an exemplary graded interconnect cap, in accordance with one or more embodiments of the present invention.

FIG. 15 depicts a detailed cross-section view of graded interconnect cap 304. The metal cap 172 and resulting graded cap 304 have one or more sidewall surfaces (e.g., left sidewall surface 312 and right sidewall surface 332), one or more interconnect facing surface (e.g., lower surface 342), and one or more interconnect away-facing surface (e.g., upper surface 322). The interconnect away-facing surface(s) are exposed (i.e. are not protected) and subjected to nitrogen by process 302. In other words, during process 302 nitrogen is diffused into metal cap 172 at the exposed metal cap 172 surface(s). On the other hand, because the one or more interconnect facing surfaces are protected by interconnect 162 and by liner 146 those one or more interconnect facing surfaces are not directly exposed to nitrogen in process 302 and nitrogen does not diffuse into graded cap 302 therefrom.

The graded microstructure of graded cap 304 includes the gradually or uniformly changing microstructure from a first material that has a first metal to nitrogen ratio at an internal location of cap 304 to a second material that has a second metal to nitrogen ratio that has an increased quantity of Nitrogen relative to the first metal to nitrogen ratio at a perimeter location of cap 304. Graded cap section 340 is entirely within the graded cap 304 nearest the interconnect 162 facing surface(s) at the intersection of the graded cap 304 and interconnect 162. Section 320 is entirely within the graded cap 304 nearest the one or more interconnect away-facing surfaces (e.g., upper surface 322).

In a first implementation, the first material at section 340 may be pure metal with no Nitrogen and the second material at section 320 may be the metal nitride with the percent Nitrogen greater than zero percent. In a second implementation, the second material at section 320 may be the metal nitride with a percent Nitrogen approaching the stoichiometric amount of Nitrogen to form the metal nitride, or a maximum percentage of Nitrogen possible within the metal nitride, and the first material at section 240 is the metal nitride with a percent Nitrogen less than the aforementioned percentage of Nitrogen. The second implementation may be most beneficial to reduce the overall capacitance of the BEOL wiring stack. In a third implementation, the first material at section 340 may be the metal nitride with a variable "n" percent Nitrogen, wherein "n" is greater than zero. The second material at section 320 may be the metal nitride with the percent Nitrogen greater than "n" percent and less than "m" percent, wherein "m" is less than the maximum percentage of Nitrogen of the metal nitride.

Graded cap 304 includes a gradient 350 of gradually or uniformly changing microstructure from the first material at section 340 to the second material at section 320. The actual percent nitrogen in section 320 is dependent upon the thickness of metal caps 172, the time that metal caps 172 are subject to nitriding process 304, and the like. For example, as depicted in FIG. 15, the microstructure in section 342 has a lower or zero percent Nitrogen and is depicted as mostly white. The microstructure in section 320 has a greater percent Nitrogen is depicted as mostly black. Gradient 350 exists between section 340 and section 320 as is depicted by gradually or uniformly darkening from mostly white nearest section 340 to mostly black nearest section 320. The direction of gradient 350 is from or to any point within section 340 to or from any point within section 320. The gradient 350 is uniform if the change in percent nitrogen of microstructure material along gradient 350 per the same dimension of gradient 350 is constant.

Figure 16:
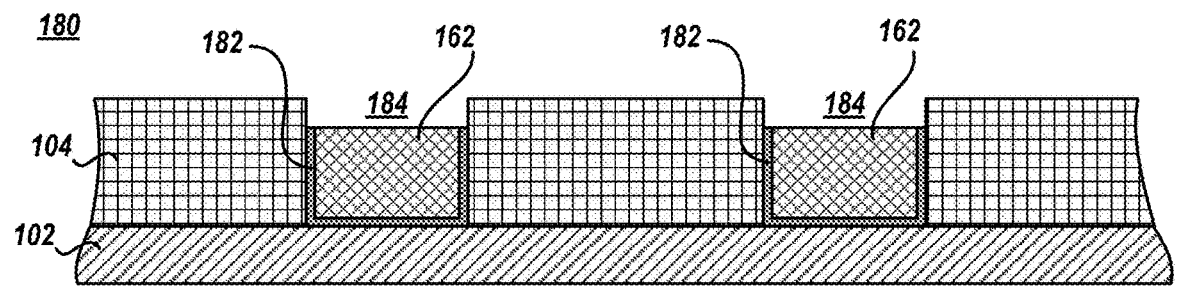
FIG. 16-FIG. 18 depict cross-section views of exemplary semiconductor structures at various stages of semiconductor device fabrication, in accordance with one or more embodiments of the present invention.

FIG. 16 shows a cross-sectional view of semiconductor structure 180. Structure 180 includes a recessed interconnect 162 and recessed liner 182 within first IMD 104. The recessed liner 182 is upon the interconnect trench 112 walls between the recessed interconnect 162 and the first IMD 104 and between the recessed interconnect 162 and substrate 102. The copper layer 132 and the liner layer 122, shown in FIG. 7, may be polished back or partially removed using a chemical-mechanical polishing (CMP) process to a plane that is coplanar with the upper surface of the first IMD 104. Further copper layer 122 and liner layer 122 within interconnect trench 112 is partially removed from within trench 112 forming a cap trench 184 between the sidewalls of the first IMD 104 associated with trench 112, above the recessed interconnect 162, and below the plane that is coplanar with the upper surface of the first IMD 104. The cap trench 184 is a void between exposed sidewalls of the first IMD 104 associated with trench 112 above recessed interconnect 162 and below the top surface of the first IMD 104. Recessed interconnect 162 and recessed liner 182 may be formed by other known techniques.

Figure 17:
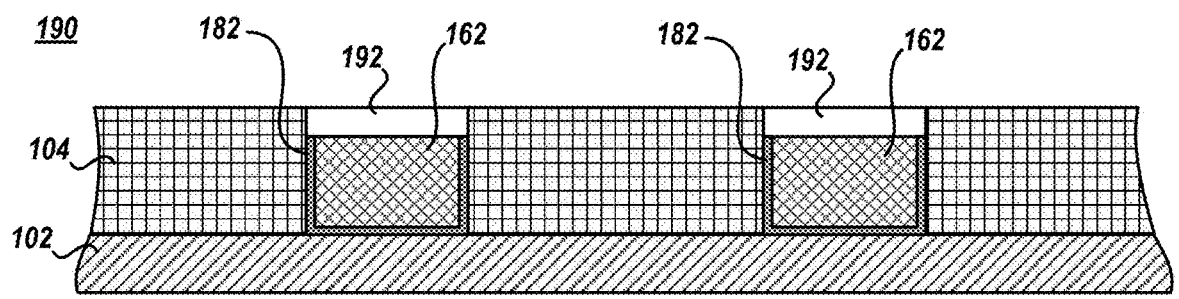

FIG. 17 shows a cross-sectional view of semiconductor structure 190. Structure 190 includes metal caps 192 within cap trench 184 upon recessed interconnects 162. Metal caps 192 may be formed by selectively forming metal, such as Aluminum, using selective CVD, ALD, PVD, plating or other appropriate deposition method, upon only the recessed interconnects 162 between the exposed sidewalls of the first 1 MB 104 associated with trench 112. The metal caps 192 may be formed to a thickness that is less than traditional interconnect caps to eventually reduce the overall capacitance of the BEOL interconnect layers as is further described below. In other implementations, metal caps 192 may be formed upon interconnects 162 and upon liner 182 by other known selective metal deposition techniques. An upper surface of metal cap 192 may be coplanar with the upper surface of the first 1 MB 104.

Figure 18:
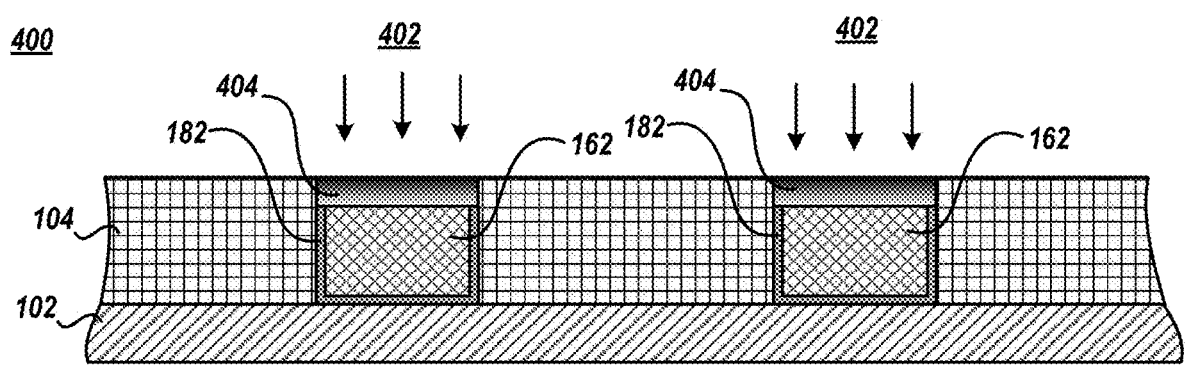

FIG. 18 shows a cross-sectional view of semiconductor structure 400. Structure 400 includes graded caps 404 formed from metal caps 192 by subjecting the metal caps 192 to a controlled nitriding processes 402. Nitriding process 402 is a heat-treating process that diffuses nitrogen into the metal caps 192 to form graded caps 404. The nitriding process 402 is controlled to generate the graded microstructure of graded cap 404. For example, the time structure 190 is subjected to process 402 is controlled to result in the specified graded microstructure of graded cap 404.

Figure 22:
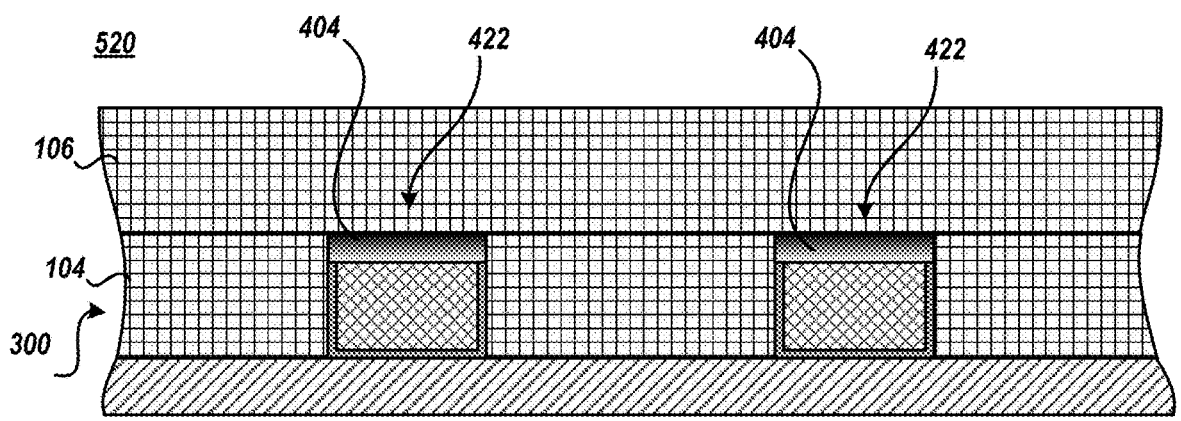

Graded cap 404 may function as a localized sealing layer cap upon only the recessed interconnect 162 to prevent copper diffusion and oxidation of interconnect 162. Therefore, referring to FIG. 22, a second IMD layer 106 can be deposited upon exposed surface 422 of graded cap 304 and upon exposed upper surface of the first IMD 104 without a conventional sealing layer therebetween to form semiconductor structure 520. In other words, problems associated with the conventional sealing layer may be reduced or eliminated (e.g., TDDB improvement due to elimination of a possibly weak tri-material bond between the liner, interconnect, and conventional sealing layer). In another scheme, a conventional sealing layer is maintained and formed upon exposed surface 422 of graded cap 304 and upon exposed upper surface of the first IMD 104. Subsequently the second IMD 106 may be deposited upon the conventional sealing layer.

Figure 19:
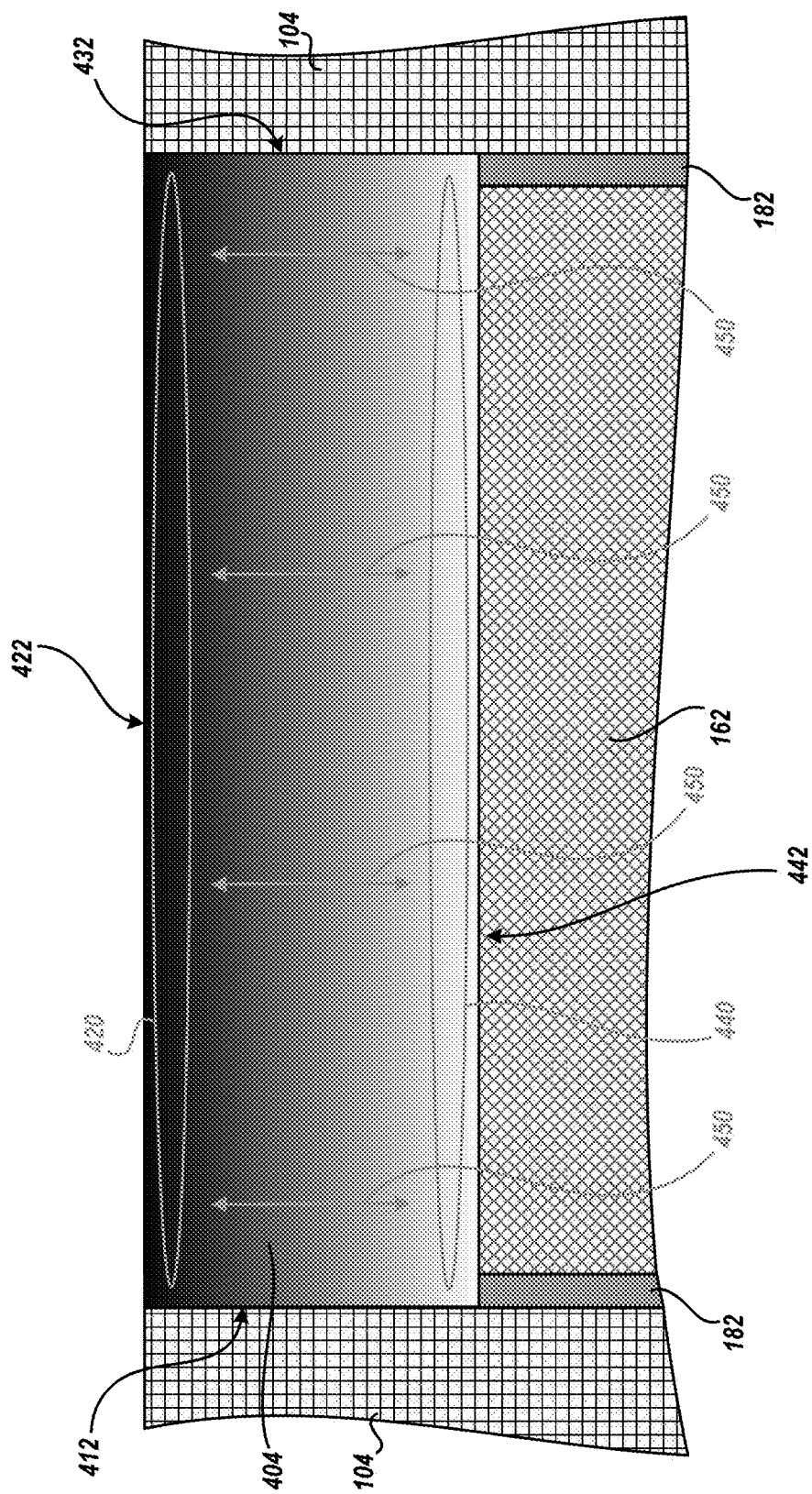
FIG. 19 depicts a detailed cross-section view of an exemplary graded interconnect cap, in accordance with one or more embodiments of the present invention.

FIG. 19 depicts a detailed cross-section view of graded interconnect cap 404. The metal cap 192 and resulting graded cap 404 have one or more sidewall surfaces (e.g., left sidewall surface 412 and right sidewall surface 432), one or more interconnect facing surface (e.g., lower surface 442), and one or more interconnect away-facing surface (e.g., upper surface 422). The interconnect away-facing surface(s) are exposed (i.e. are not protected) and subjected to nitrogen by process 402. In other words, during process 402 nitrogen is diffused into metal cap 192 at the exposed metal cap 192 surface(s). On the other hand, the protected surfaces are not directly exposed to nitrogen in process 402 and nitrogen does not diffuse into graded cap 404 therefrom.

The graded microstructure of graded cap 404 includes the gradually or uniformly changing microstructure from a first material that has a first metal to nitrogen ratio at an internal location of cap 404 to a second material that has a second metal to nitrogen ratio that has an increased quantity of Nitrogen relative to the first metal to nitrogen ratio at a perimeter location of cap 404. Graded cap section 440 is entirely within the graded cap 404 nearest the interconnect 162 facing surface(s) at the intersection of the graded cap 404 and interconnect 162. Section 420 is entirely within the graded cap 404 nearest the one or more interconnect away-facing surfaces (e.g., upper surface 422).

In a first implementation, the first material at section 440 may be pure metal with no Nitrogen and the second material at section 420 may be the metal nitride with the percent Nitrogen greater than zero percent. In a second implementation, the second material at section 420 may be metal nitride with a percent Nitrogen approaching the stoichiometric amount of Nitrogen to form the metal nitride, or a maximum percentage of Nitrogen within the metal nitride, and the first material at section 440 is the metal nitride with a percent Nitrogen less than then aforementioned percent Nitrogen. The second implementation may be most beneficial to reduce the overall capacitance of the BEOL wiring stack. In a third implementation, the first material at section 440 may be the metal nitride with a variable "n" percent Nitrogen, wherein "n" is greater than zero. The second material at section 420 may be the metal nitride with the percent Nitrogen greater than "n" percent and less than "m" percent, wherein "m" is less than the maximum percentage of Nitrogen of the metal nitride.

Graded cap 404 includes a gradient 450 of gradually or uniformly changing microstructure from the first material at section 440 to the second material at section 320. The actual percent nitrogen in section 420 is dependent upon the thickness of metal caps 192, the time that metal caps 192 are subject to nitriding process 304, and the like. For example, as depicted in FIG. 19, the microstructure in section 442 has a lower or zero percent Nitrogen and is depicted as mostly white. The microstructure in section 420 has a greater percent Nitrogen is depicted as mostly black. Gradient 450 exists between section 440 and section 420 as is depicted by gradually or uniformly darkening from mostly white nearest section 440 to mostly black nearest section 420. The direction of gradient 450 is from or to any point within section 440 to or from any point within section 420. The gradient 450 is uniform if the change in percent nitrogen of microstructure material along gradient 450 per the same dimension of gradient 450 is constant.

Graded caps 204, 304, and 404 may reduce the overall capacitance of the BEOL metallization or wiring stack over traditional sealing layers. As indicated, traditional sealing layers typically have the highest dielectric constant value within the BEOL metalization or wiring stack and may thus cause a high capacitance within the BEOL metalization or wiring stack. However, due to metal nitride composition that has a lower overall dielectric constant compared to traditional sealing layers and/or due to being thinner than traditional sealing layers, graded caps 204, 304, and/or 404 may reduce the overall capacitance of the BEOL metalization or wiring stack.

Figure 23:
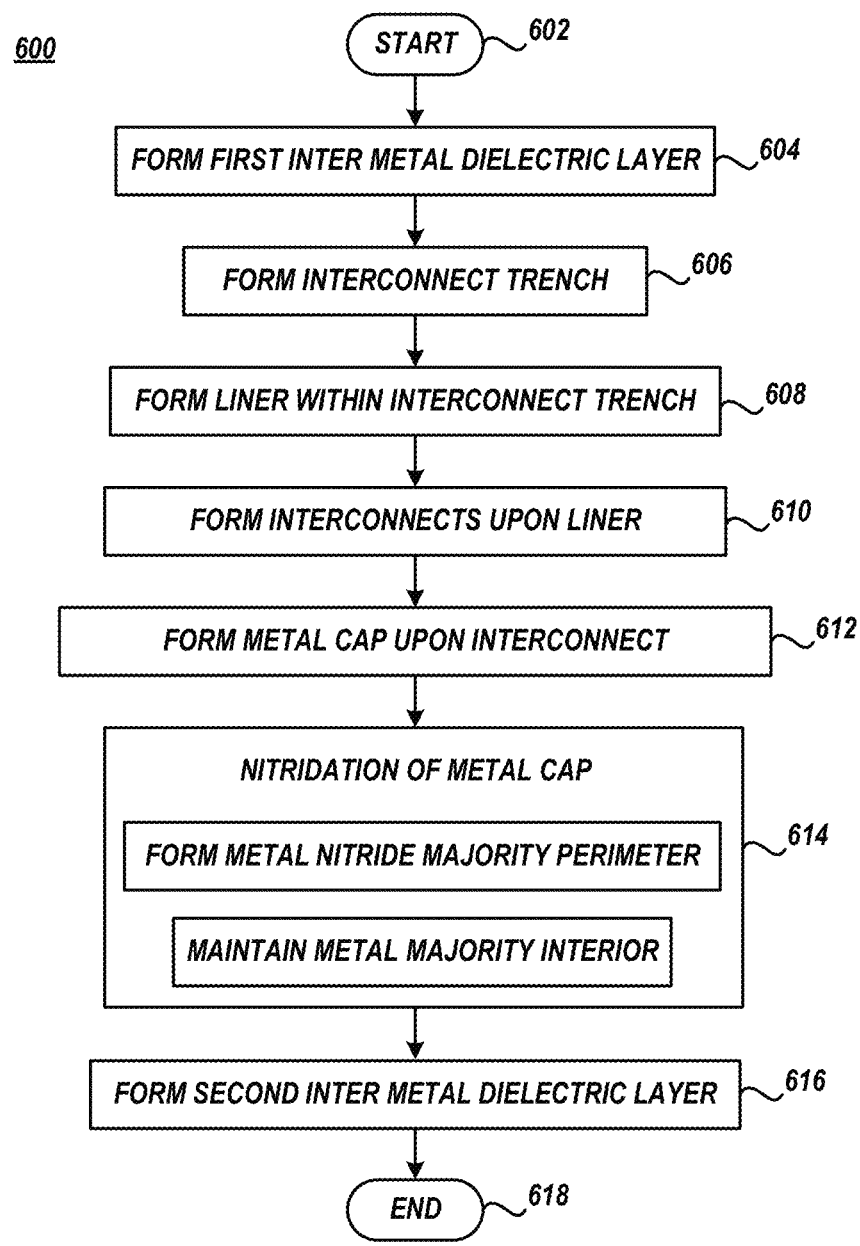
FIG. 23 depicts a semiconductor device fabrication flow diagram, in accordance with one or more embodiments of the present invention.

FIG. 23 depicts a semiconductor device fabrication method 600. Method 600 begins at block 602 and continues with forming first IMD 104 upon substrate 102 (block 602). Method 600 may continue by forming an interconnect trench 112 within first IMD 104 exposing a portion of the upper surface of the underlying substrate 102 (block 606).

Method 600 may continue with forming a liner 146, 182 upon one or more sidewall(s) of interconnect trench 112 (block 608). Method 600 may continue with forming an interconnect 146, 162 upon the liner 146, 182 (block 610). Method 600 may continue with forming a metal cap 152 upon the interconnect 144 (block 612). Alternatively, method 600 may continue with forming a metal cap 172 upon interconnect 162 between liner 146 (block 612). Alternatively, method 600 may continue with forming a metal cap 192 upon the interconnect 162 and upon the liner 182 between the first IMD 104 sidewalls of the interconnect trench 112.

Method 600 may continue with nitriding metal caps 152, 172, 192 to form respective graded caps 204, 304, 404 (block 614). Graded caps 204, 304, or 404 may be thinner from the bottom surface to the top surface than traditional caps and may thus serve to reduce the overall capacitance of the BEOL interconnect layers. The graded caps 204, 304, or 404 may also provide increased adhesion to the underlying interconnect and/or to a second intermetal dielectric layer formed thereupon.

Method 600 may continue with forming a second 1 MB layer 106 upon graded cap 204, upon upper surfaces of liner 146, and upon upper surface of the first IMD 104 (block 616). Alternatively, a second IMD layer 106 can be deposited upon graded cap 304, upon upper surfaces of liner 146, and upon upper surface of the first 1 MB 104 (block 616). Alternatively, a second IMD layer 106 can be deposited upon graded cap 344 and upon upper surface of the first IMD 104. Method 600 may end at block 618.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a carrier, with leads that are affixed to a motherboard or other higher level carrier) or in a multichip package (e.g., a carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

Unless described otherwise, or in addition to that described herein, "forming," "depositing," "deposited," etc. may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

References herein to terms such as "vertical", "horizontal", etc. are made by way of example, and not by way of limitation, to establish a frame of reference. The term "horizontal" as may be used herein is defined as a plane parallel to the conventional plane or surface of substrate 102, regardless of the actual spatial orientation of the substrate 102. The term "vertical" refers to a direction perpendicular to the horizontal, as just defined. Terms, such as "on", "above", "below", "side" (as in "sidewall"), "higher", "lower", "over", "beneath," "under", "top," "bottom," "left," "right," or the like, are used with respect to the horizontal plane. It is understood that various other frames of reference may be employed for describing the present invention without departing from the spirit and scope of the present invention.

The invention claimed is:

1. A method of semiconductor device fabrication comprising:
    forming a first intermetal dielectric layer upon a substrate;
    forming an interconnect trench within the first intermetal dielectric layer that exposes a portion of the substrate;
    forming a liner within the interconnect trench;
    forming an interconnect upon the liner filing the interconnect trench;
    forming a metal cap upon only the interconnect; and
    forming a graded cap by nitriding the metal cap.

2. The method of claim 1, wherein the graded cap comprises a metal nitride perimeter.

3. The method of claim 2, wherein the graded cap further comprises a metal interior.

4. The method of claim 3, wherein the metal nitride perimeter comprises a Nitrogen atomic weight majority and wherein the metal interior comprises a Nitrogen atomic weight minority.

5. The method of claim 4, wherein the graded interconnect cap further comprises a gradient of uniformly changing microstructure between the metal nitride perimeter and the metal interior.

6. The method of claim 4, wherein a bisector of the interconnect bisects the metal interior.

7. The method of claim 1, further comprising:
    forming a second intermetal dielectric layer directly upon the first intermetal dielectric layer, directly upon the liner, and directly upon the graded cap.

* * * * *